(12) United States Patent
Kato et al.

(10) Patent No.: US 7,563,988 B2
(45) Date of Patent: Jul. 21, 2009

(54) CIRCUIT DEVICE

(75) Inventors: Atsushi Kato, Gunma (JP); Atsushi Nakano, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 345 days.

(21) Appl. No.: 10/941,181

(22) Filed: Sep. 15, 2004

(65) Prior Publication Data
US 2005/0088806 A1    Apr. 28, 2005

(30) Foreign Application Priority Data
Sep. 24, 2003    (JP) .................... P. 2003-331635

(51) Int. Cl.
*H01R 12/04*    (2006.01)
(52) U.S. Cl. .................................... 174/261
(58) Field of Classification Search ................ 257/679, 257/783; 361/813, 683, 679, 684; 174/261
See application file for complete search history.

(56) References Cited

U.S. PATENT DOCUMENTS

| 6,347,735 | B1 * | 2/2002 | Frantz et al. ........... 228/180.22 |
| 6,562,660 | B1 | 5/2003 | Sakamoto et al. |
| 6,627,981 | B2 * | 9/2003 | Shibata ....................... 361/704 |
| 6,838,755 | B2 * | 1/2005 | Tiziani et al. ............... 257/676 |
| 7,053,492 | B2 * | 5/2006 | Takahashi et al. ........... 257/783 |
| 2002/0133943 | A1 * | 9/2002 | Sakamoto et al. ............ 29/846 |
| 2005/0104198 | A1 * | 5/2005 | Takahashi ................... 257/708 |
| 2005/0263320 | A1 * | 12/2005 | Igarashi et al. .............. 174/255 |
| 2005/0263846 | A1 * | 12/2005 | Inoue et al. ................. 257/531 |

FOREIGN PATENT DOCUMENTS

| JP | 11-340257 | 12/1999 |
| JP | 2003-174111 | 6/2003 |

* cited by examiner

*Primary Examiner*—Dean A. Reichard
*Assistant Examiner*—Abiy Getachew
(74) *Attorney, Agent, or Firm*—Fish & Richardson P.C.

(57) ABSTRACT

Provided is a circuit device which has a wiring part for forming an electric circuit therein. A circuit device, in which a circuit element and conductive patterns, which form an electric circuit, are integrally resin-molded, includes: a conductive pattern through which an electric signal passes, the electric signal being inputted/outputted between the electric circuit and the outside; and a wiring part which branches off from the conductive pattern and through which an electric signal passes, the electric signal being inputted to another portion of the electric circuit. According to the circuit device of the present invention, an electric signal inputted/outputted between a built-in electric circuit and the outside can be inputted to another spot of the electric circuit through wiring formed inside the device. Therefore, a pattern structure of a mounting board can be simplified.

24 Claims, 7 Drawing Sheets

CIRCUIT DEVICE

BACKGROUND OF THE INVENTION

Priority is claimed to Japanese Patent Application Number JP2003-331635 filed on Sep. 24, 2003, the disclosure of which is incorporated herein by reference in its entirety.

1. Field of the Invention

The present invention relates to a circuit device, more particularly to a circuit device having a wiring part for forming an electric circuit therein.

2. Description of the Related Art

With reference to FIGS. 8A and 8B, a constitution of a conventional semiconductor device 100 will be described. FIG. 8A is a plan view of the semiconductor device 100 and FIG. 8B is a section view thereof (see Patent Document 1).

With reference to FIG. 8A, a land 102 made of a conductive material is formed at the central portion of the semiconductor device 100 and one end of each of a plurality of leads 101 is made close to the periphery of the land 102. The one end of each of the plurality of leads 101 is electrically connected to a semiconductor element 104 by a thin metal wire 105 and the other end thereof is exposed from a sealing resin 103. The sealing resin 103 has a function to seal and collectively support the semiconductor element 104, the land 102 and the leads 101.

[Patent Document 1]
Japanese Patent Laid-Open Hei 11 (1999)-340257

SUMMARY OF THE INVENTION

However, in the device described above, the leads 101 only function as external terminals. Thus, it was required to form conductive paths for forming an electric circuit on a surface of a mounting board on which the semiconductor device 100 is mounted. Consequently, there was a problem that a wiring structure of the mounting board is complicated.

The preferred embodiment of the present invention was made in view of the above described problem. A principal object of the preferred embodiment of the present invention is to provide a circuit device having a wiring part for forming an electric circuit therein.

A circuit device of the preferred embodiment of the present invention, which has circuit element and conductive pattern for forming an electric circuit, includes: a conductive pattern through which an electric signal passes, the electric signal being inputted/outputted between the electric circuit and the outside; and a wiring part which branches off from the conductive pattern and through which the electric signal passes, the electric signal being inputted to another portion of the electric circuit.

Furthermore, a circuit device of the preferred embodiment of the present invention, which has circuit element and conductive pattern for forming an electric circuit, includes: a first conductive pattern through which a first electric signal passes, the first electric signal being inputted/outputted between the electric circuit and the outside; a second conductive pattern through which a second electric signal passes, the second electric signal being inputted/outputted between the electric circuit and the outside and having a potential different from that of the first electric signal; a first wiring part which branches off from the first conductive pattern and through which the first electric signal passes; and a second wiring part which branches off from the second conductive pattern and through which the second electric signal passes. In the circuit device, any of the first electric signal passing through the first wiring part and the second electric signal passing through the second wiring part is inputted to the electric circuit.

According to the circuit device of the preferred embodiment of the present invention, an electric signal inputted/outputted between a built-in electric circuit and the outside can be inputted to another spot of the electric circuit through wiring formed inside the device. Therefore, a pattern structure of a mounting board can be simplified.

DESCRIPTION OF THE EMBODIMENTS

Figure 1A:
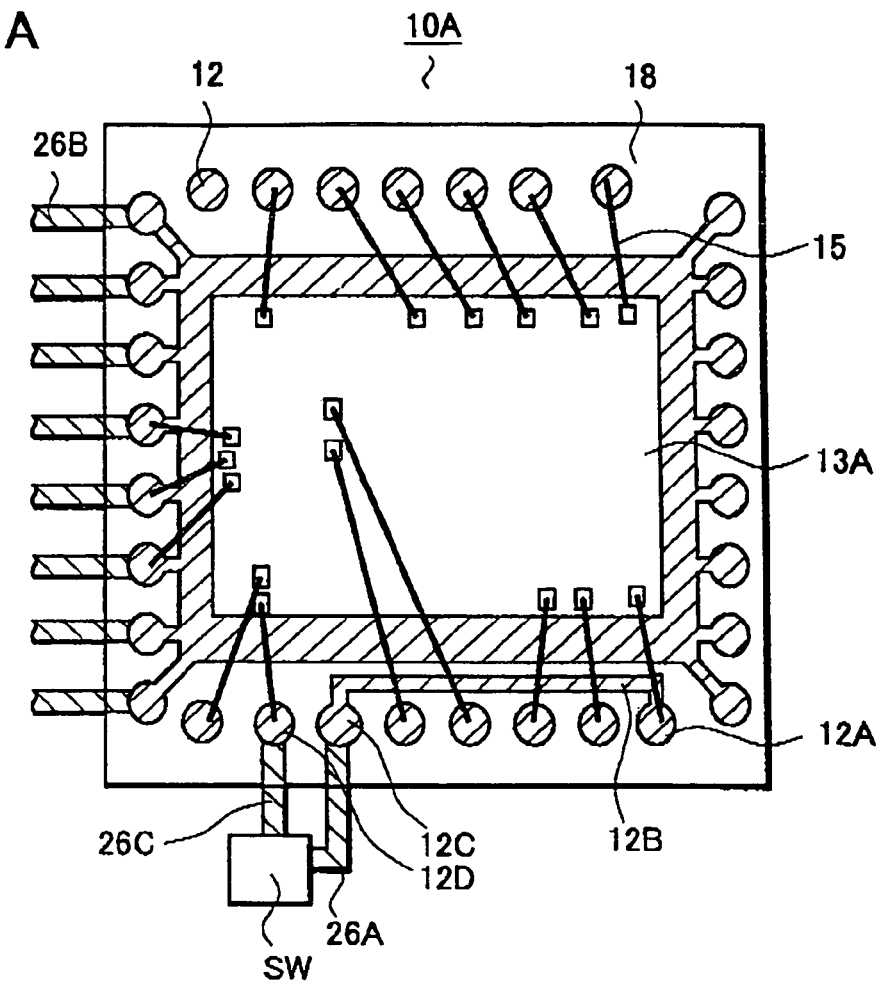
FIGS. 1A and 1B are a plan view and a section view showing a circuit device of a preferred embodiment of the present invention.
Figure 1B:
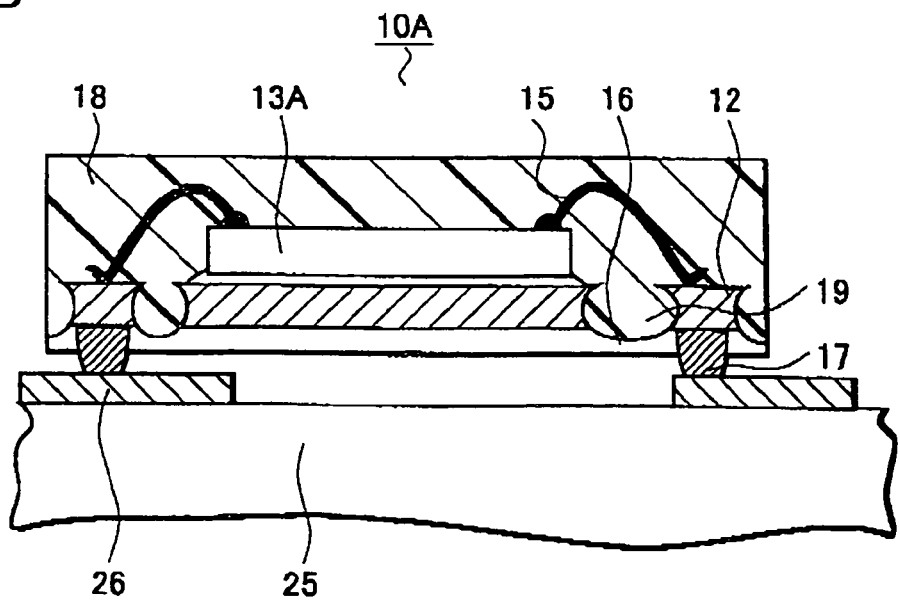

With reference to FIGS. 1A and 1B, description will be given of a constitution of a circuit device 10A of this embodiment. FIG. 1A is a plan view of the circuit device 10A and FIG. 1B is a section view thereof.

With reference to FIG. 1A, the circuit device 10A of this embodiment has a constitution in which a circuit element 13 and conductive patterns 12, which form an electric circuit, are integrally resin-molded. Furthermore, the circuit device 10A includes: a conductive pattern 12A through which an electric signal passes, the electric signal being inputted/outputted between the electric circuit described above and the outside; and a wiring part 12B which branches off from the conductive pattern 12A and through which an electric signal passes, the electric signal being inputted to another portion of the electric circuit. Details of each component and a constitution relating thereto will be described below.

The conductive patterns 12 are made of a metal such as copper. These conductive patterns 12 are separated by a sealing resin 18 filled in a isolation trench 19 formed by etching. Here, the conductive patterns 12 mainly form a die pad, on which a semiconductor element 13A is mounted, bonding pads, which are disposed so as to surround the die pad and to which thin metal wire is connected, and the like.

The conductive pattern 12A is electrically connected to the semiconductor element 13A through thin metal wire 15. An electric signal inputted/outputted from/to the outside passes through the conductive pattern 12A. As the electric signal described above, there is an input signal which is supplied from the outside to the electric circuit formed in the circuit device 10A. Furthermore, as the electric signal described above, there is an output signal which is processed by the electric circuit formed in the circuit device 10A and outputted to the outside. To be more specific, as the electric signal described above, a power supply potential, a ground potential, an output signal processed inside the device and the like are conceivable. Here, the electric circuit formed in the device means, for example, an electric circuit including the conductive patterns 12, the thin metal wire 15 and the circuit element 13.

The wiring part 12B is formed of the conductive pattern 12 described above and electrically connects the conductive pattern 12A to a conductive pattern 12C. The conductive patterns 12A and 12C are disposed apart from each other while interleaving a plurality of the conductive patterns 12 therebetween. The both patterns can be electrically connected to each other by the wiring part 12B. Here, the conductive patterns 12 positioned on the same side are connected to each other by the wiring part 12B. However, the conductive patterns 12 positioned on different sides can be also connected to each other by the wiring part 12B. Specifically, by connecting the conductive patterns to each other by the wiring part 12B, an electric signal outputted from the built-in electric circuit can be outputted from the plurality of conductive patterns 12 which are disposed apart from each other. Moreover, an electric signal inputted through one of the conductive patterns 12 can be also branched off through the wiring part 12B. Consequently, one input signal can be also supplied to a plurality of spots of the built-in electric circuit.

As the circuit element 13, the semiconductor element 13A is herein adopted. An active element such as, an LSI chip, a bare transistor chip, and a diode can be adopted as the circuit element 13. Furthermore, a passive element such as a chip resistor, a chip capacitor, and an inductor can be also adopted as the circuit element 13. The semiconductor element 13A has its back die bonded to the die pad formed of the conductive pattern 12. Electrodes on a surface of the semiconductor element 13A and the bonding pads formed of the conductive patterns 12 are electrically connected to each other through the thin metal wire 15. Moreover, the semiconductor element 13A can be also connected thereto face down. A chip element 13B has electrodes on its both ends, which are die bonded to the conductive patterns 12 with a brazing material such as soft solder.

The sealing resin 18 is made of thermoplastic resin formed by injection molding or thermosetting resin formed by transfer molding. The sealing resin 18 has a function to seal the whole device as well as to mechanically support the whole device. With reference to FIG. 1B, the sealing resin 18 exposes rear surface of the conductive patterns 12 to the outside and seals the circuit element 13, the thin metal wire 15 and the conductive patterns 12.

With reference to FIG. 1B, description will be given of a connection structure between the circuit device 10A and a mounting board 25. A bottom surface of the sealing resin 18, on which the conductive patterns 12 are exposed, is covered with a resist 16 made of resin except spots where external electrodes 17 are formed. The external electrodes 17 are made of a brazing material such as soft solder and formed on the rear surface of the conductive patterns 12. By melting the external electrodes 17 by reflow, conductive paths 26 formed on a surface of the mounting board 25 and the circuit device 10A are electrically connected to each other. Moreover, on the surface of the mounting board 25, a plurality of elements may be mounted other than the circuit device 10A.

With reference to FIG. 1A, conductive paths 26B are electrically connected to the conductive patterns 12 through the external electrodes 17 and are connected to other device on the mounting board 25.

Here, description will be given of an advantage of having the wiring part 12B. The conductive pattern 12A is electrically connected to the conductive pattern 12C through the wiring part 12B. A conductive path 26A at the mounting board 25 side is connected to the conductive pattern 12C through the external electrode 17. The conductive path 26A and a conductive path 26C are connected to each other through a switching part SW formed on the surface of the mounting board 25. A conductive pattern 12D of the circuit device 10A and the conductive path 26C are connected to each other through the external electrode 17. Moreover, the conductive pattern 12D is electrically connected to the semiconductor element 13A through the metal thin wire 15. Here, it is also possible to have the switching part SW built into the circuit device 10A.

According to the constitution described above, for example, when an output signal from the semiconductor element 13A is supplied to the conductive pattern 12A, the output signal is fed back to the electric circuit in the circuit device 10A through the wiring part 12B. Specifically, a route of the feedback includes the wiring part 12B, the conductive pattern 12C, the external electrode 17, the conductive path 26A, the switching part SW, the conductive path 26C and the conductive pattern 12D. Accordingly, the electric signal is interrupted or conducted by the switching part SW. Thus, operations of the electric circuit built into the circuit device 10A can be switched. Specifically, the operations of the electric circuit are changed based on whether or not the electric signal outputted to the outside through the conductive pattern 12A is supplied to the conductive pattern 12D.

Moreover, the conductive pattern 12C, from which the electric signal is outputted, and the conductive pattern 12D, through which the electric signal inputted via the switching part SW passes, are adjacent to each other. Therefore, the conductive paths 26 which connect the conductive patterns 12C and 12D via the switching part SW can be shortened.

As described above, by routing the wiring part 12B in the device, a pattern structure of the conductive paths 26 at the mounting board 25 side can be simplified. Particularly, as shown in FIG. 1A, considering the case where the external electrodes are formed in a peripheral portion of the circuit device 10A, a complicated constitution of the conductive paths 26 is required when the wiring part is formed on the mounting board 25 side. To be more specific, when wiring formed of the conductive paths 26 is formed on the mounting board 25, the wiring has to cross the conductive paths 26B connected to the external electrodes 17 in most cases. Therefore, such an intersecting constitution of the conductive paths 26 leads to a complicated wiring structure and costs may be increased. In the present embodiment, the wiring part 12B is provided in the circuit device 10A. Thus, the constitution of the conductive paths 26 can be significantly simplified.

Moreover, in the above description, the electric circuit including one semiconductor element 13A is built into the circuit device 10A. However, an electric circuit including a plurality of semiconductor elements or passive elements may be formed therein. Furthermore, in the above description, the output signal from the built-in electric circuit is branched off through the wiring part 12B. However, the electric signal inputted from the outside may be branched off through the wiring part 12B.

With reference to a plan view of FIG. 2, a constitution of a circuit device 10B of another embodiment will be described.

In the circuit device 10B, conductive patterns 12 include a first and a second conductive patterns 12A and 12E. Through the first conductive pattern 12A, a first electric signal inputted/outputted between the device and the outside passes. Through the second conductive pattern 12E, a second electric signal having a potential different from that of the first electric signal passes. A basic constitution of the circuit device 10B shown in FIG. 2 is common to that of the circuit device 10A shown in FIG. 1A. The circuit device 10B is different from the circuit device 10A in having a second wiring part 12B2. Such a difference will be mainly described.

The first conductive pattern 12A is connected to a conductive pattern 12C through a first wiring part 12B1. The conductive pattern 12C is connected to a conductive path 26A at a mounting board side through an external electrode 17. In such a manner, input/output of the branched off first electric signal to the outside is performed through the first wiring part 12B1.

The second conductive pattern 12E is connected to a conductive pattern 12F through the second wiring part 12B2. The second conductive pattern 12E is a conductive pattern through which the second electric signal having a potential different from that of the first electric signal described above passes. The conductive pattern 12F is connected to a conductive path 26B at the mounting board side through the external electrode 17 and electrically connected to a switching part SW.

A conductive pattern 12D is a conductive pattern to which the first or the second electric signal described above is inputted. The conductive pattern 12D is connected to a semiconductor element 13A through a thin metal wire 15 and is connected to a conductive path 26C, to which an output signal of the switching part SW is supplied, through the external electrode 17.

The switching part SW has a function to selectively supply the first electric signal, which is supplied through the conductive path 26A, or the second electric signal, which is supplied through the conductive path 26B, to the conductive path 26C. Therefore, this function of the switching part SW makes it possible to change the electric signal supplied to the semiconductor element 13A from the conductive pattern 12D. Thus, operations of the circuit built into the circuit device 10B can be changed.

By use of the first and second wiring parts 12B1 and 12B2 described above, the first and second electric signals can be branched off and outputted from the vicinity of the conductive pattern 12D. Therefore, a constitution of the conductive paths 26 which connect the respective conductive patterns 12 to the switching part SW can be simplified. Furthermore, a length of the conductive paths 26 can be shortened.

According to the constitution described above, any of the first electric signal, which is outputted from the first conductive pattern 12A, and the second electric signal, which is outputted from the second conductive pattern 12E, can be supplied to the electric circuit in the circuit device through the conductive pattern 12D. Therefore, the electric circuit built into the circuit device 10B performs different operations between the case where the first electric signal is supplied and the case where the second electric signal is supplied. As a combination of the first and second electric signals, a power supply potential and a ground potential, of which potentials are significantly different from each other, can be adopted.

With reference to a plan view of FIG. 3, a constitution of a circuit device 10C of another embodiment will be described. The constitution of the circuit device 10C shown in FIG. 3 is basically similar to that of the circuit device 10B shown in FIG. 2. The circuit device 10C is different from the circuit device 10B in that a switching part SW is built therein. Specifically, a switching part SW formed of a switching element such as a transistor is formed on a conductive pattern 12. According to the constitution described above, a constitution of conductive paths 26 formed on a surface of a mounting board 25, on which the circuit device 10C is mounted, can be more simplified.

Figure 3:
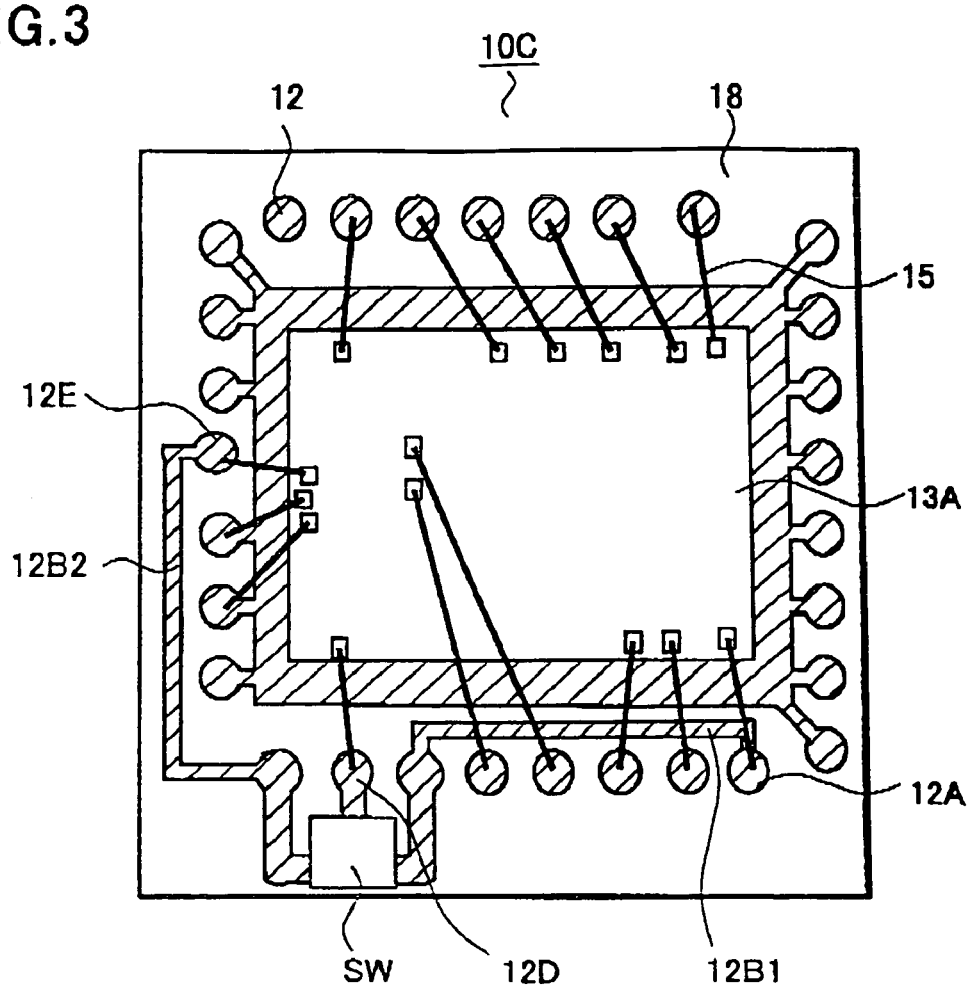
FIG. 3 is a plan view showing a circuit device of the preferred embodiment of the present invention.
Figure 4:
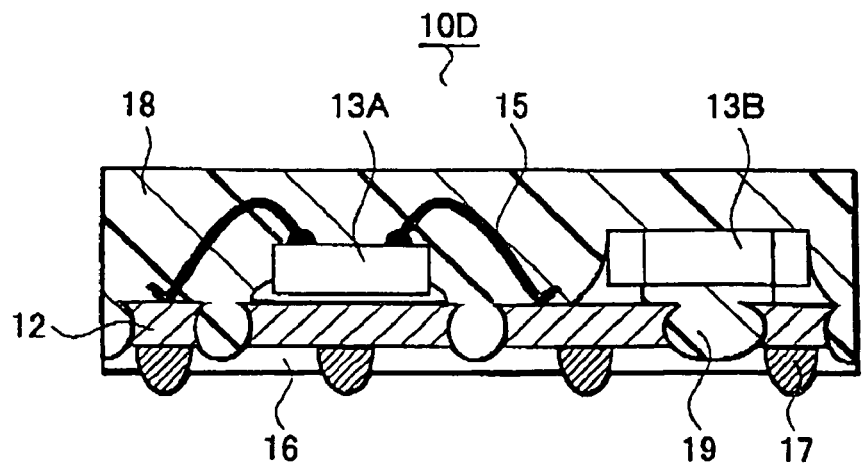
FIG. 4 is a section view showing a circuit device of the preferred embodiment of the present invention.

With reference to a section view of FIG. 4, in a circuit device 10D shown in FIG. 4, a semiconductor element 13A and a chip element 13B are adopted as circuit elements 13. In each of the circuit devices 10 shown in FIGS. 1 to 3, one semiconductor element 13A is provided. However, as described above, the electric circuit in the circuit device may include a plurality of circuit elements 13. As a concrete connection structure of the circuit elements, electrodes of the semiconductor element 13A, which is die bonded to the conductive pattern 12 face up, are connected to the conductive patterns 12 through thin metal wire 15. The chip element 13B has electrodes on its both ends, which are die bonded to the conductive patterns 12 by use of a brazing material such as soft solder.

Figure 5A:
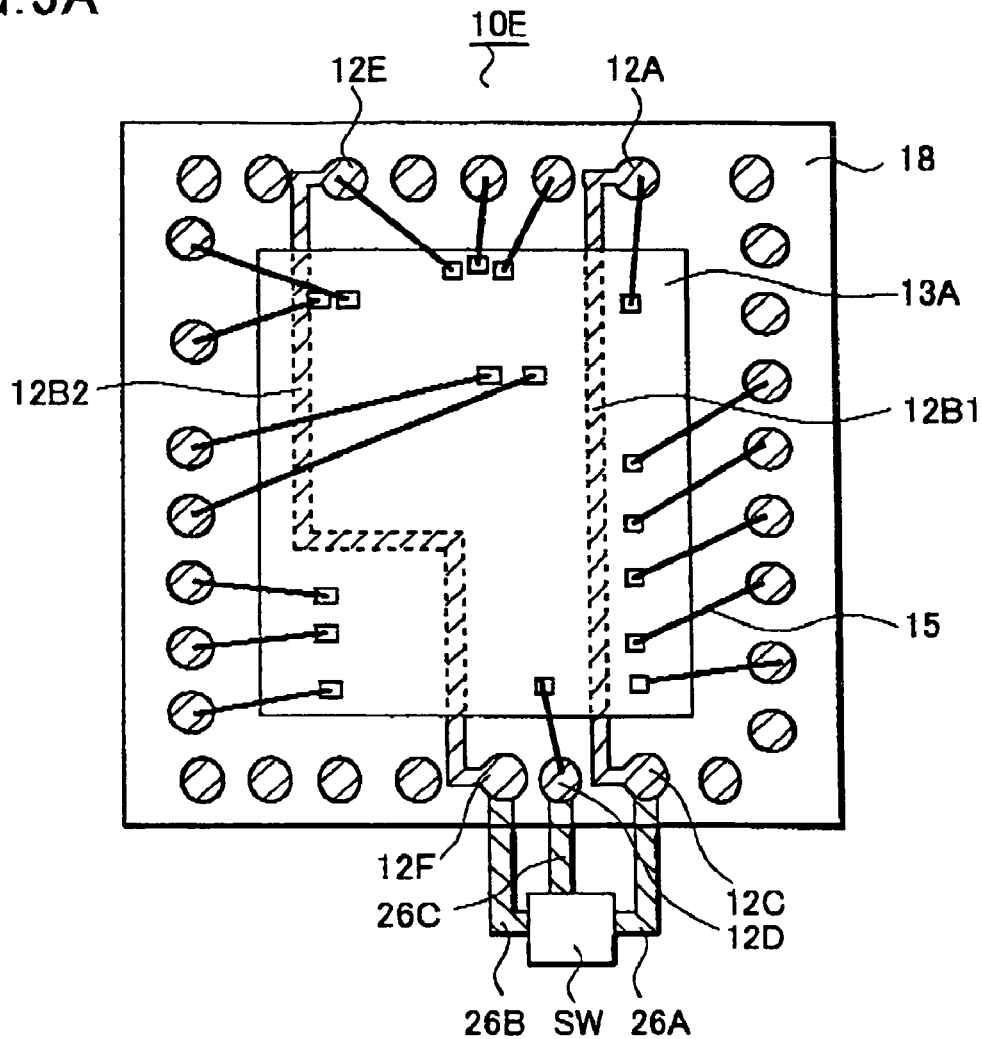
FIGS. 5A and 5B are a plan view and a section view showing a circuit device of the preferred embodiment of the present invention.
Figure 5B:
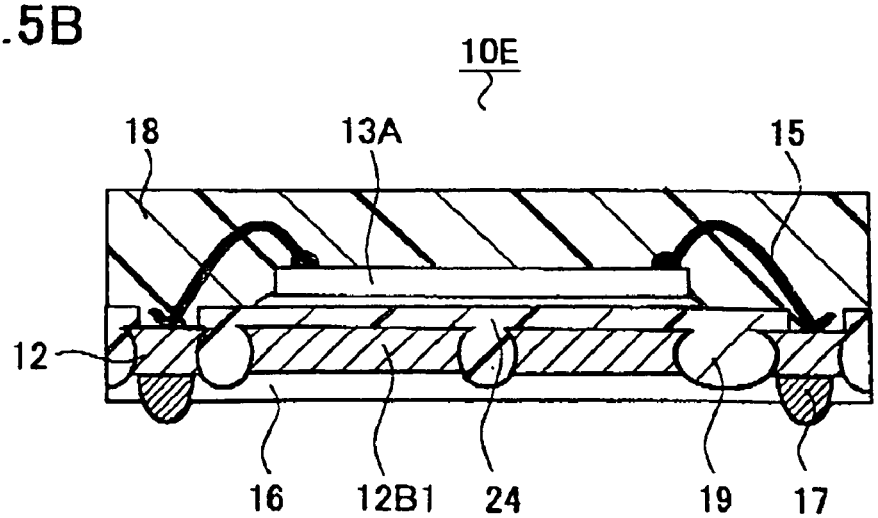

With reference to FIGS. 5A and 5B, a constitution of a circuit device 10E of another embodiment will be described. FIG. 5A is a plan view of the circuit device 10E and FIG. 5B is a section view thereof.

Figure 2:
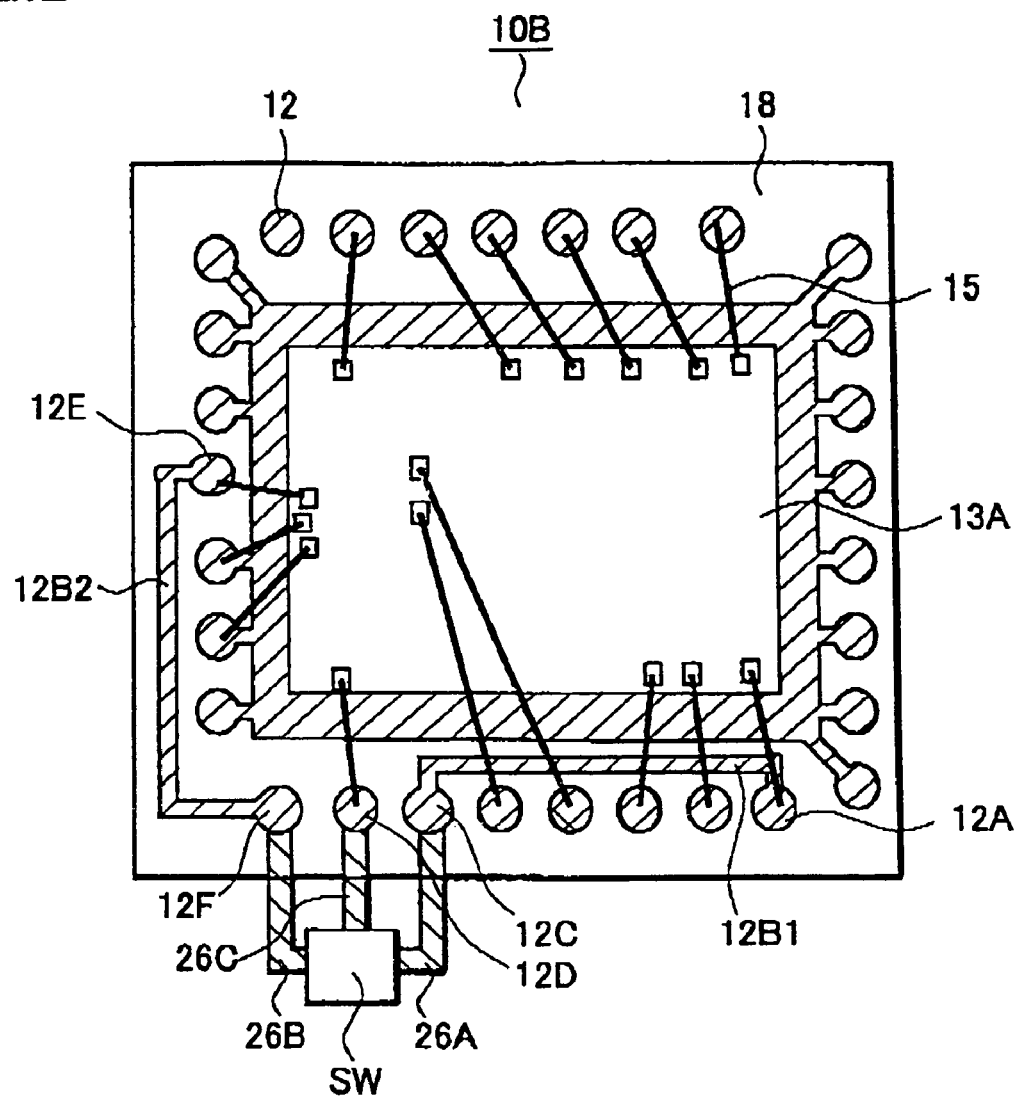
FIG. 2 is a plan view showing a circuit device of the preferred embodiment of the present invention.

With reference to FIG. 5A, the constitution of the circuit device 10E is similar to that of the circuit device 10B shown in FIG. 2 and is different therefrom in a constitution of wiring parts 12B. Specifically, here, first and second wiring parts 12B1 and 12B2 extend below a semiconductor element 13A. To be more specific, the first wiring part 12B1 extends below the semiconductor element 13A from a first conductive pattern 12A through which a first electric signal passes. The first conductive pattern 12A is connected to a conductive pattern 12C positioned in a peripheral portion of a different side. Moreover, a second conductive pattern 12E, through which a second electric signal passes, is connected to a conductive pattern 12F through the second wiring part 12B2 extending below the semiconductor element 13A. A constitution of a switching part SW and conductive paths 26 other than those described above is similar to that shown in FIG. 2.

With reference to FIG. 5B, a cross-sectional structure of the circuit device 10E will be described. The conductive patterns 12 are covered with a coating resin 24 and the semiconductor element 13A is die bonded to a surface of this coating resin 24. According to the constitution described above, the conductive patterns 12 can be routed below a region where the circuit element 13 such as the semiconductor element 13A is disposed. Thus, wiring density can be improved. Moreover, upper surfaces of the conductive patterns 12 in spots to be electrically connected to the circuit element 13 are exposed from the coating resin 24. Here, upper surfaces of the conductive patterns 12 in regions to be bonding pads are exposed from the coating resin 24.

An advantage of the constitution described above will be described. Since the wiring parts 12B can be extended below the semiconductor element 13A, a degree of freedom in designing the conductive patterns 12 can be improved. For example, even if the first conductive pattern 12A and the conductive pattern 12C are provided apart from each other, the both patterns can be connected to each other through the first wiring part 12B1. Here, the first conductive pattern 12A and the conductive pattern 12C, which are positioned in peripheral portions opposite to each other, are connected to each other through the first wiring part 12B1.

Figure 6A:
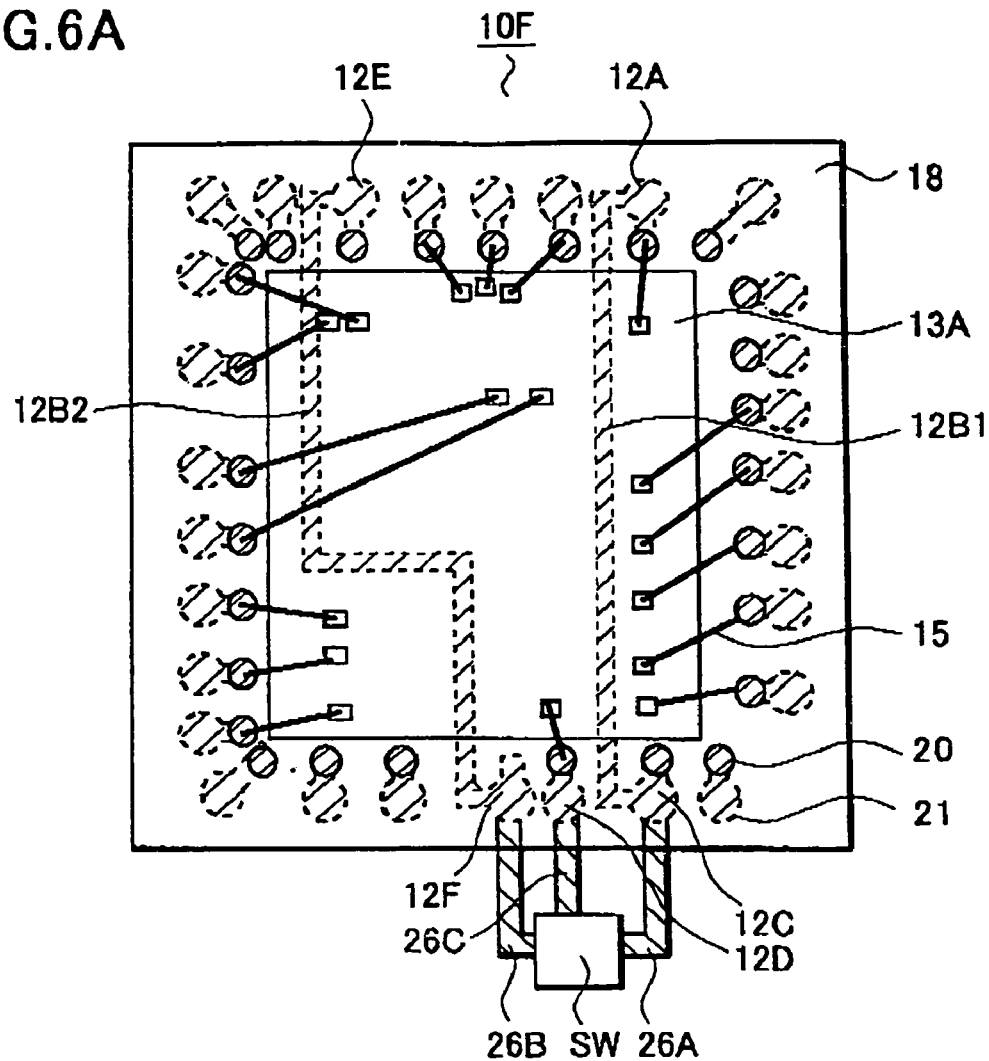
FIGS. 6A and 6B are a plan view and a section view showing a circuit device of the preferred embodiment of the present invention.
Figure 6B:
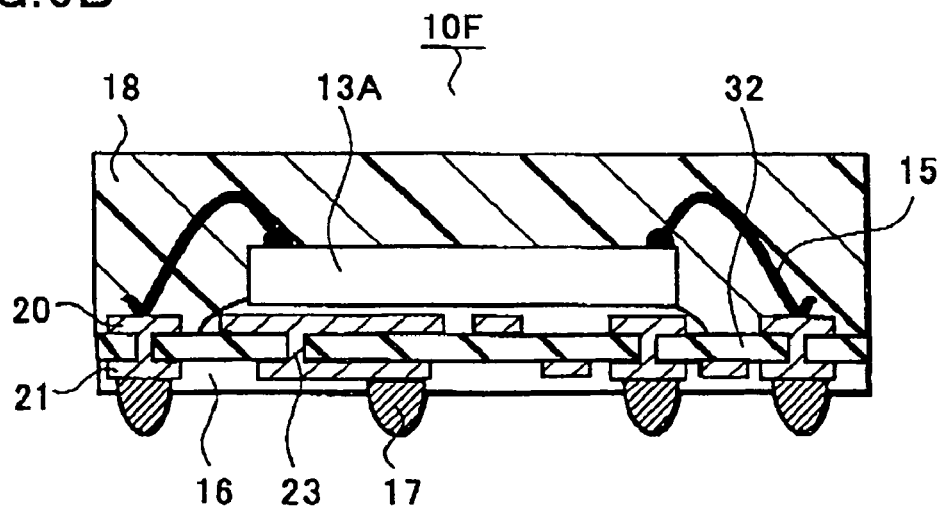

With reference to FIGS. 6A and 6B, a constitution of a circuit device 10F of another embodiment will be described. FIG. 6A is a plan view of the circuit device 10F and FIG. 6B is a section view thereof. A basic constitution of the circuit device 10F shown in FIGS. 6A and 6B is similar to that of the circuit device 10E shown in FIGS. 5A and 5B and is different therefrom in having a plurality of wiring layers. This difference will be mainly described.

With reference to FIG. 6A, a first wiring layer 20 that is an upper wiring layer is indicated by a solid line, and a second wiring layer 21 that is a lower wiring layer is indicated by a dotted line. The first wiring layer 20, the upper layer, forms a bonding pad part, to which thin metal wire 15 is connected, and is connected to the second wiring layer 21, the lower layer, through connection parts 23. First and second wiring parts 12B1 and 12B2 are formed of the second wiring layer 21, the lower layer. Moreover, it is also possible that the wiring parts 12B are formed of the first wiring layer 20. Other than those described above, the constitution of the circuit device 10F is similar to that shown in FIGS. 5A and 5B.

With reference to FIG. 6B, here, the circuit device 10F has two wiring layers including the first and second wiring layers 20 and 21, which are laminated on each other with an insulation layer 32 interposed therebetween. The first and second wiring layers 20 and 21 are electrically connected to each other through the connection parts 23 penetrating the insulation layer 32. Note that, as a structure of the wiring layers, a wiring structure including three layers or more is also possible.

Figure 7:
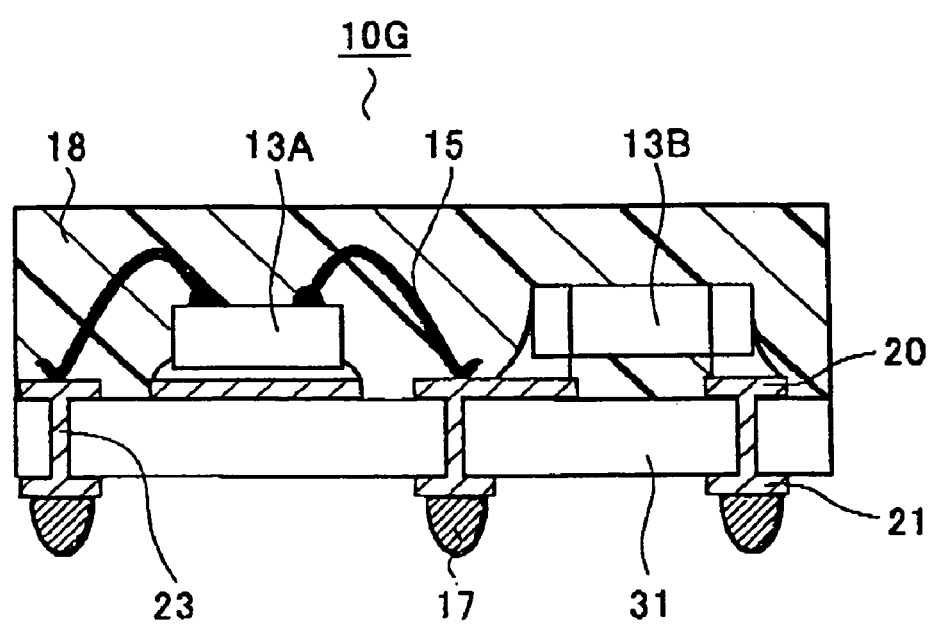
FIG. 7 is a section view showing a circuit device of the preferred embodiment of the present invention.
Figure 8A:
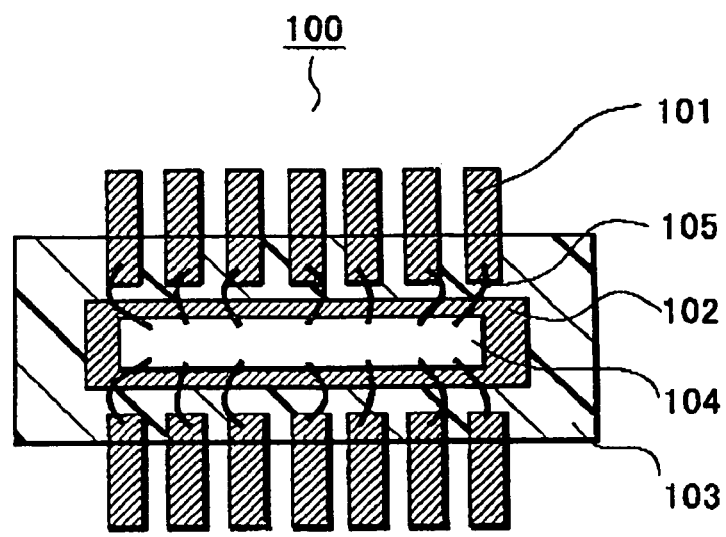
FIGS. 8A and 8B are a plan view and a section view showing a conventional circuit device.
Figure 8B:
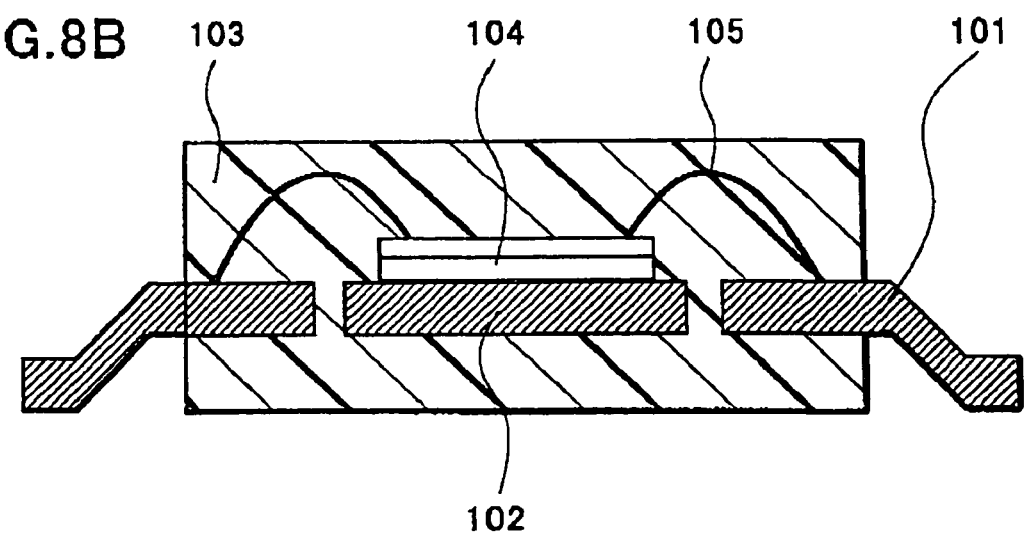

With reference to FIG. 7, a constitution of a circuit device 10G of another embodiment will be described. FIG. 7 shows a section of the circuit device 10G A basic constitution of the circuit device 10G shown in FIG. 7 is similar to that of the circuit device 10F shown in FIGS. 6A and 6B and is different therefrom in having a supporting board 31. As this supporting board 31, a well known board, including a board made of resin board such as a glass epoxy resin board, a ceramic board, a metal board can be used.

What is claimed is:

1. A circuit device comprising:
   a circuit element and a conductive pattern forming an electric circuit, wherein the conductive pattern comprises a die pad and a first bonding pad, wherein the conductive pattern is arranged to pass an electric signal that is provided to or received from a location outside the electric circuit, and wherein the conductive pattern further comprises a wiring part that is separate from the die pad, that extends from the first bonding pad to a second bonding pad in the circuit device and that is arranged to pass the electric signal to another portion of the electric circuit.

2. The circuit device according to claim 1, wherein the electric signal is provided by a circuit element positioned outside the electric circuit.

3. The circuit device according to claim 1, further comprising:
   a multi-layered wiring structure including first and second wiring layers,
   wherein the wiring part is formed in any of the first or second wiring layers.

4. The circuit device according to claim 1, wherein the circuit element and the conductive pattern are sealed by a sealing resin while exposing a rear surface of the conductive pattern.

5. The circuit device according to claim 1, wherein the wiring part extends through a lower portion of the circuit device.

6. A circuit device comprising: a circuit element and a conductive pattern forming an electric circuit,
   wherein the circuit element includes a semiconductor element and is mounted to a surface of a coating resin that covers the conductive pattern,
   wherein the conductive pattern comprises a first bonding pad and is arranged to pass an electric signal that is provided to or received from a location outside the electric circuit, and
   wherein the conductive pattern further comprises a wiring part that extends below the semiconductor element, that connects the first bonding pad to a second bonding pad in the circuit device and that is arranged to pass the electric signal to another portion of the electric circuit.

7. The circuit device according to claim 6, wherein the electric signal is provided by a circuit element positioned outside the electric circuit.

8. The circuit device according to claim 6, further comprising:
   a multi-layered wiring structure including first and second wiring layers,
   wherein the wiring part is formed in any of the first or second wiring layers.

9. The circuit device according to claim 6, wherein the circuit element and the conductive pattern are sealed by a sealing resin while exposing a rear surface of the conductive pattern.

10. A circuit device comprising:
    a circuit element and a conductive pattern forming an electric circuit
       wherein the conductive pattern comprises a die pad, a first bonding pad, and a second bonding pad, wherein the conductive pattern is arranged to pass first and second electric signals that are provided to or received from a location outside the electric circuit, wherein the second electric signal has a potential that is different from that of the first electric signal,
       wherein the conductive pattern comprises a first wiring part that is separate from the die pad, that extends from the first bonding pad to a third bonding pad in the circuit device and that is arranged to pass the first electric signal,
    wherein the conductive pattern further comprises second wiring part that is separate from the die pad, that extends from the second bonding pad to a fourth bonding pad in the circuit device and that is arranged to pass the second electric signal, and
    wherein any of the first or second electric signals is provided to the electric circuit.

11. The circuit device according to claim 10, wherein the first or second electric signal is provided to the electric circuit by a circuit element positioned outside the electric circuit.

12. The circuit device according to claim 10, further comprising:
    a multi-layered wiring structure including first and second wiring layers,
    wherein the wiring parts are formed in any of the first or second wiring layers.

13. The circuit device according to claim 10, wherein the circuit element and the conductive pattern are sealed by a sealing resin while exposing a rear surface of the conductive pattern.

14. The circuit device according to claim 10, wherein the wiring parts extend through a lower portion of the circuit device.

15. The circuit device according to claim 10, wherein the first electric signal is a power supply potential and the second electric signal is a ground potential.

16. A circuit device comprising: a circuit element and a conductive pattern forming an electric circuit,
    wherein the circuit element includes a semiconductor element and is mounted to a surface of a coating resin that covers the conductive pattern,
wherein the conductive pattern comprises a first bonding pad and a second bonding pad, wherein the conductive pattern is arranged to pass first and second electric signals that are provided to or received from a location outside the electric circuit, wherein the second electric signal has a potential that is different from that of the first electric signal, wherein the conductive pattern comprises a first wiring part that extends below the semiconductor element connects the first bonding pad to a third bonding pad in the circuit device and that is arranged to pass the first electric signal, wherein the conductive pattern further comprises a second wiring part that extends below the semiconductor element, that connects the second bonding pad to a fourth bonding pad in the circuit device and that is arranged to pass the second electric signal, and wherein any of the first or second electric signals is provided to the electric circuit.

17. The circuit device according to claim 16, wherein the first or second electric signal is provided to the electric circuit by a circuit element positioned outside the electric circuit.

18. The circuit device according to claim 16, further comprising:

a multi-layered wiring structure including first and second wiring layers, wherein the wiring parts are formed in any of the first or second wiring layers.

19. The circuit device according to claim 16, wherein the circuit element and the conductive pattern are sealed by a sealing resin while exposing a rear surface of the conductive pattern.

20. The circuit device according to claim 16, wherein the first electric signal is a power supply potential and the second electric signal is a ground potential.

21. The circuit device according to claim 1, wherein the wiring part extends directly from the first bonding pad to the second bonding pad.

22. The circuit device according to claim 6, wherein the wiring part extends directly from the first bonding pad to the second bonding pad.

23. The circuit device according to claim 10, wherein the first wiring part extends directly from the first bonding pad to the third bonding pad, and wherein the second wiring part extends directly from the second bonding pad to the fourth bonding pad.

24. The circuit device according to claim 16, wherein the first wiring part extends directly from the first bonding pad to the third bonding pad, and wherein the second wiring part extends directly from the second bonding pad to the fourth bonding pad.

\* \* \* \* \*